(12) United States Patent
Abe et al.

(10) Patent No.: US 11,574,979 B2
(45) Date of Patent: Feb. 7, 2023

(54) DISPLAY DEVICE

(71) Applicant: SHARP KABUSHIKI KAISHA, Sakai (JP)

(72) Inventors: Kaoru Abe, Sakai (JP); Takeshi Yaneda, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 33 days.

(21) Appl. No.: 17/043,609

(22) PCT Filed: Mar. 30, 2018

(86) PCT No.: PCT/JP2018/013697
§ 371 (c)(1),
(2) Date: Sep. 29, 2020

(87) PCT Pub. No.: WO2019/187029
PCT Pub. Date: Oct. 3, 2019

(65) Prior Publication Data
US 2021/0020719 A1    Jan. 21, 2021

(51) Int. Cl.
*H01L 27/32* (2006.01)

(52) U.S. Cl.
CPC ...... *H01L 27/3269* (2013.01); *H01L 27/3223* (2013.01)

(58) Field of Classification Search
CPC ............. H01L 27/3269; H01L 27/3223; H01L 27/3216–3218
See application file for complete search history.

(56) References Cited

U.S. PATENT DOCUMENTS

| | | | |
|---|---|---|---|
| 2005/0168491 A1* | 8/2005 | Takahara | G09G 3/3283 345/690 |
| 2011/0069051 A1* | 3/2011 | Nakamura | G09G 3/3233 345/207 |
| 2016/0233283 A1* | 8/2016 | Kim | H01L 51/529 |
| 2016/0321993 A1* | 11/2016 | Choi | G09G 3/2018 |
| 2017/0062544 A1* | 3/2017 | Kang | H01L 27/3223 |
| 2017/0270855 A1* | 9/2017 | Maeda | G09G 3/3233 |
| 2017/0278446 A1* | 9/2017 | Ishiyama | G02F 1/134309 |
| 2019/0081118 A1* | 3/2019 | Oh | H01L 27/326 |
| 2019/0198811 A1* | 6/2019 | Choi | H01L 51/5259 |
| 2019/0206933 A1* | 7/2019 | Kim | H01L 51/0558 |
| 2019/0265824 A1* | 8/2019 | Abe | G06F 3/0443 |
| 2019/0349544 A1* | 11/2019 | Lee | H01L 27/14621 |

FOREIGN PATENT DOCUMENTS

JP   2007-187761 A   7/2007

* cited by examiner

*Primary Examiner* — Eric K Ashbahian
(74) *Attorney, Agent, or Firm* — ScienBiziP, P.C.

(57) ABSTRACT

An opening, which is provided on the inner side of a first pixel electrode, which is a first electrode formed in a display region, is larger than an opening, which is provided on the inner side of a second pixel electrode, which is the first electrode formed in a dummy display region. Further, a light-emitting layer (a first light-emitting layer) formed in the display region has the same shape and the same size as a light-emitting layer (a second light-emitting layer) formed in the dummy display region.

12 Claims, 11 Drawing Sheets

(a)

(b)

(c)

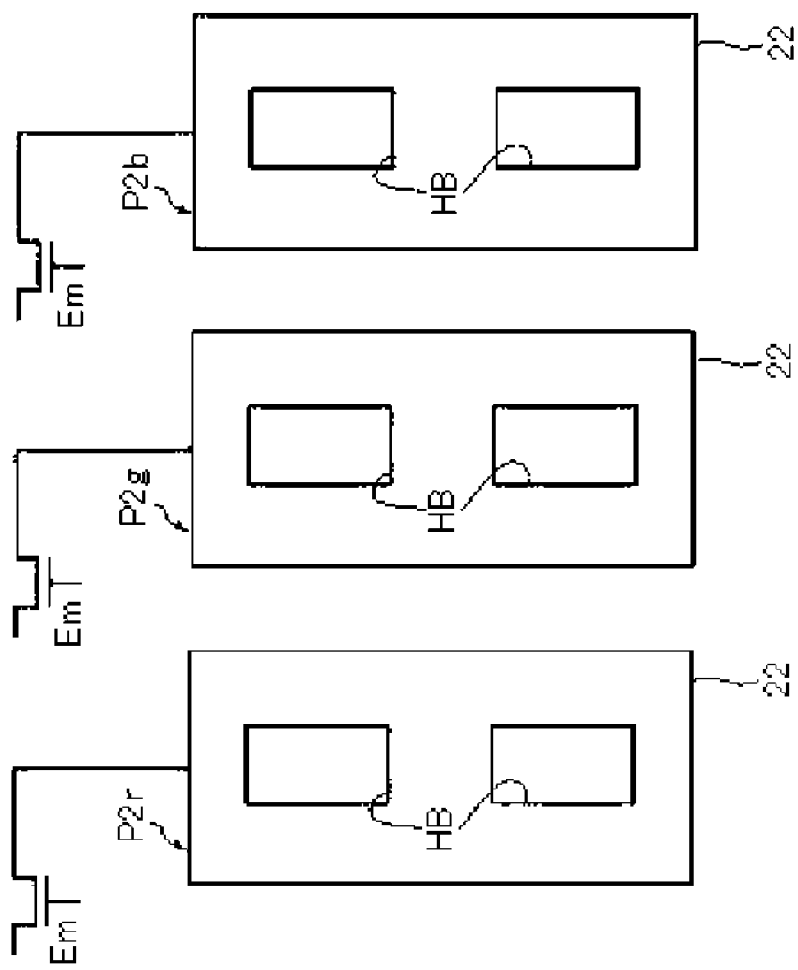

DISPLAY DEVICE

TECHNICAL FIELD

The disclosure relates to a display device.

BACKGROUND ART

In recent years, an organic EL display device, which uses organic electroluminescence (EL) elements (light-emitting elements) and is of a self-luminous type, has attracted attention as a display device that can replace a liquid crystal display device. Here, in the organic EL display device, for example, as described in PTL 1 to be described below, it is proposed to provide dummy pixels outside a display region, measure a light emission luminance of the dummy pixels, and based on the measurement result, correct input display data of the light-emitting elements.

CITATION LIST

Patent Literature

PTL 1: JP 2007-187761 A

SUMMARY

Technical Problem

However, in the known organic EL display device as described above, the dummy pixel has the same structure as an effective display pixel provided in the display region. Therefore, in the known organic EL display device, the dummy pixels need to be provided with the same manufacturing accuracy as the effective display pixels, and thus, it has not been possible to prevent a deterioration in a manufacturing yield of the organic EL display device.

In light of the problem described above, an object of the disclosure is to provide a display device that can prevent a deterioration in a manufacturing yield, even when dummy pixels are provided therein.

Solution to Problem

In order to achieve the object described above, a display device according to the disclosure includes a first electrode, a flattening film formed in a layer above the first electrode and covering an end portion of the first electrode, a light-emitting layer formed in a layer above the first electrode, and a second electrode formed in a layer above the light-emitting layer. The display device includes a display region, a dummy display region, and a luminance sensor region configured to detect a light emission luminance of the dummy display region. The first opening formed on an inner side of a first pixel electrode, the first pixel electrode being the first electrode formed in the display region, is larger than a second opening formed on an inner side of a second pixel electrode, the second pixel electrode being the first electrode formed in the dummy display region. The first light-emitting layer, the first light-emitting layer being the light-emitting layer formed in the display region, has the same shape and the same size as a second light-emitting layer, the second light-emitting layer being the light-emitting layer formed in the dummy display region.

Advantageous Effects of Disclosure

According to the disclosure, a display device can be provided that can prevent a deterioration in a manufacturing yield, even when dummy pixels are provided therein.

BRIEF DESCRIPTION OF DRAWINGS

FIG. 11 is a plan view illustrating another configuration example of the main portions of the organic EL display device according to the embodiment.

DESCRIPTION OF EMBODIMENTS

Embodiments of the disclosure will be described below in detail with reference to the drawings. Note that the disclosure is not limited to the embodiments described below. Further, the following description will be made by giving an example in which the disclosure is applied to an organic EL display device. In addition, in each of the drawings, the dimensions of constituent elements are not precisely illustrated as the actual dimensions of the constituent elements and the dimensional proportions of each of the constituent elements.

Embodiment

Figure 1:
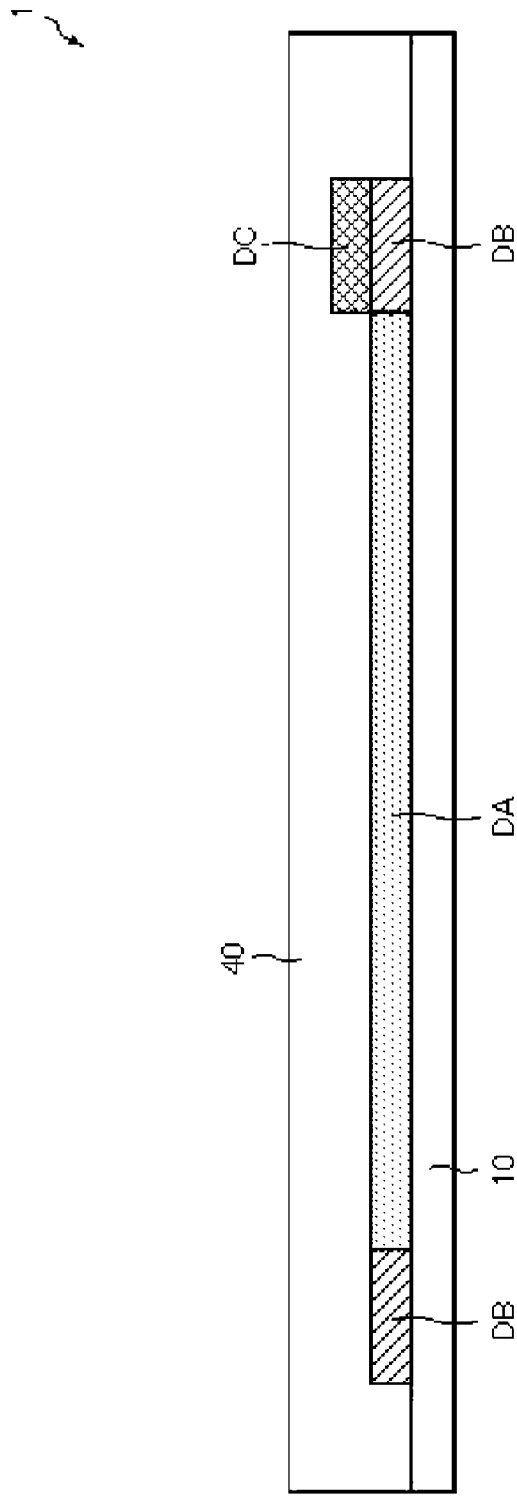
FIG. 1 is a side view illustrating a configuration of main portions of an organic EL display device according to an embodiment of the disclosure.
Figure 2:
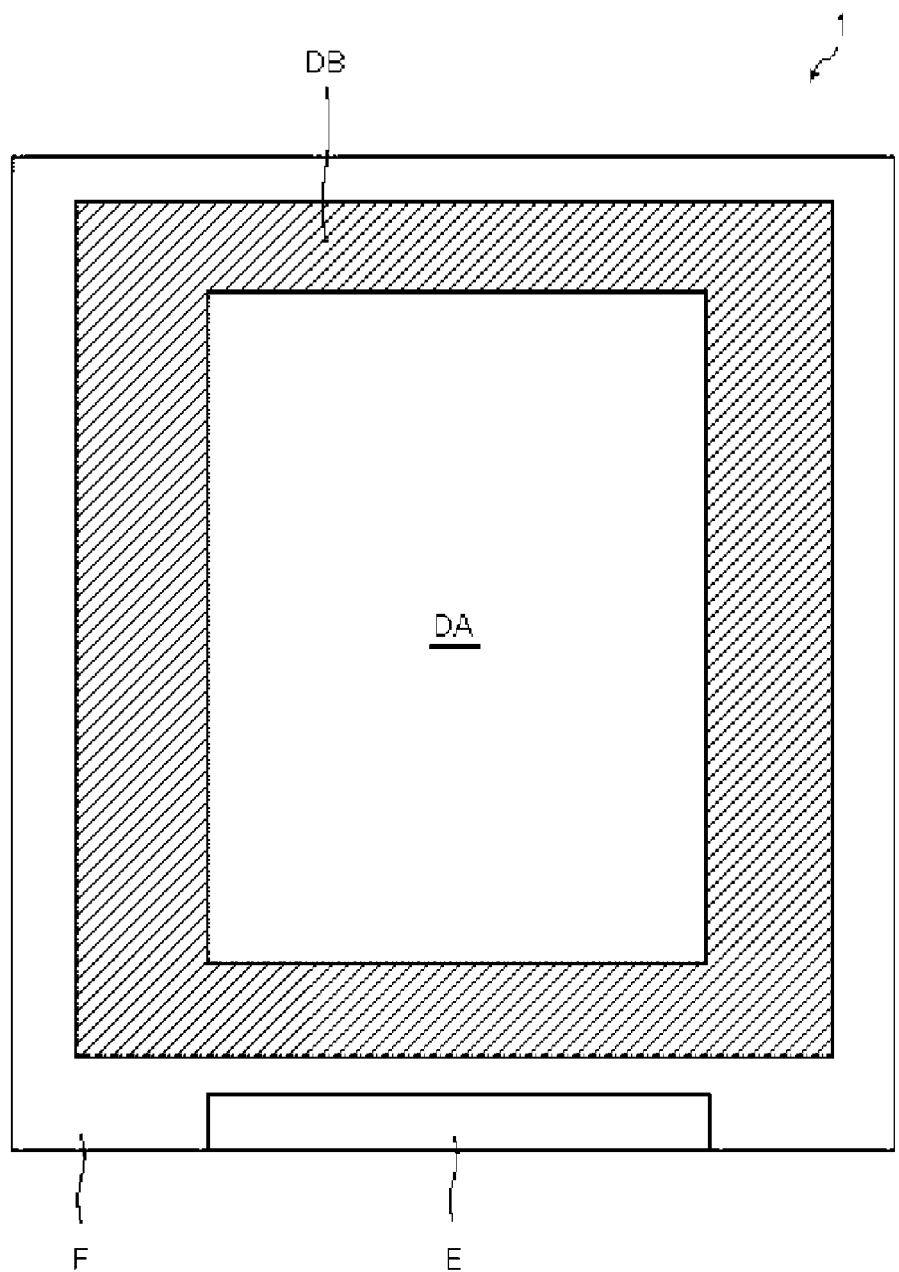
FIG. 2 is a plan view illustrating the configuration of the main portions of the organic EL display device.
Figure 3:
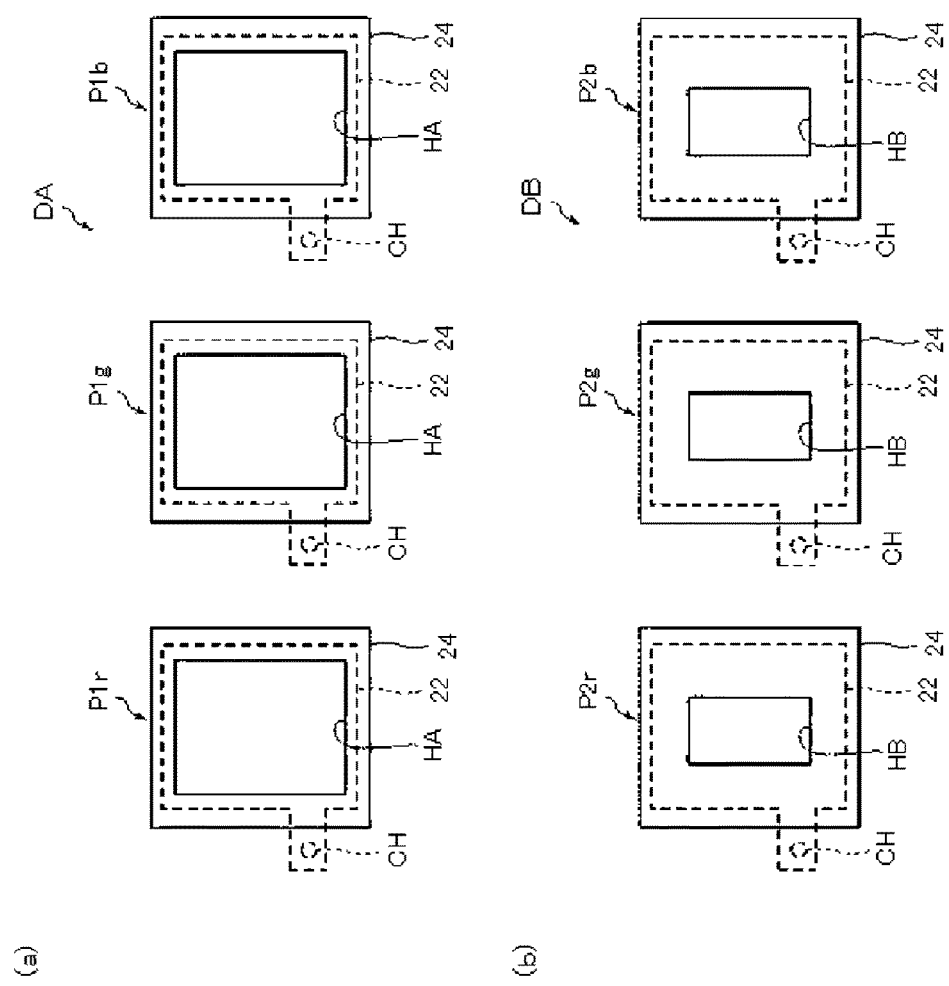
FIG. 3($a$) and FIG. 3($b$) are plan views describing structures of subpixels in a display region and a dummy display region illustrated in FIG. 2, respectively.
Figure 4:
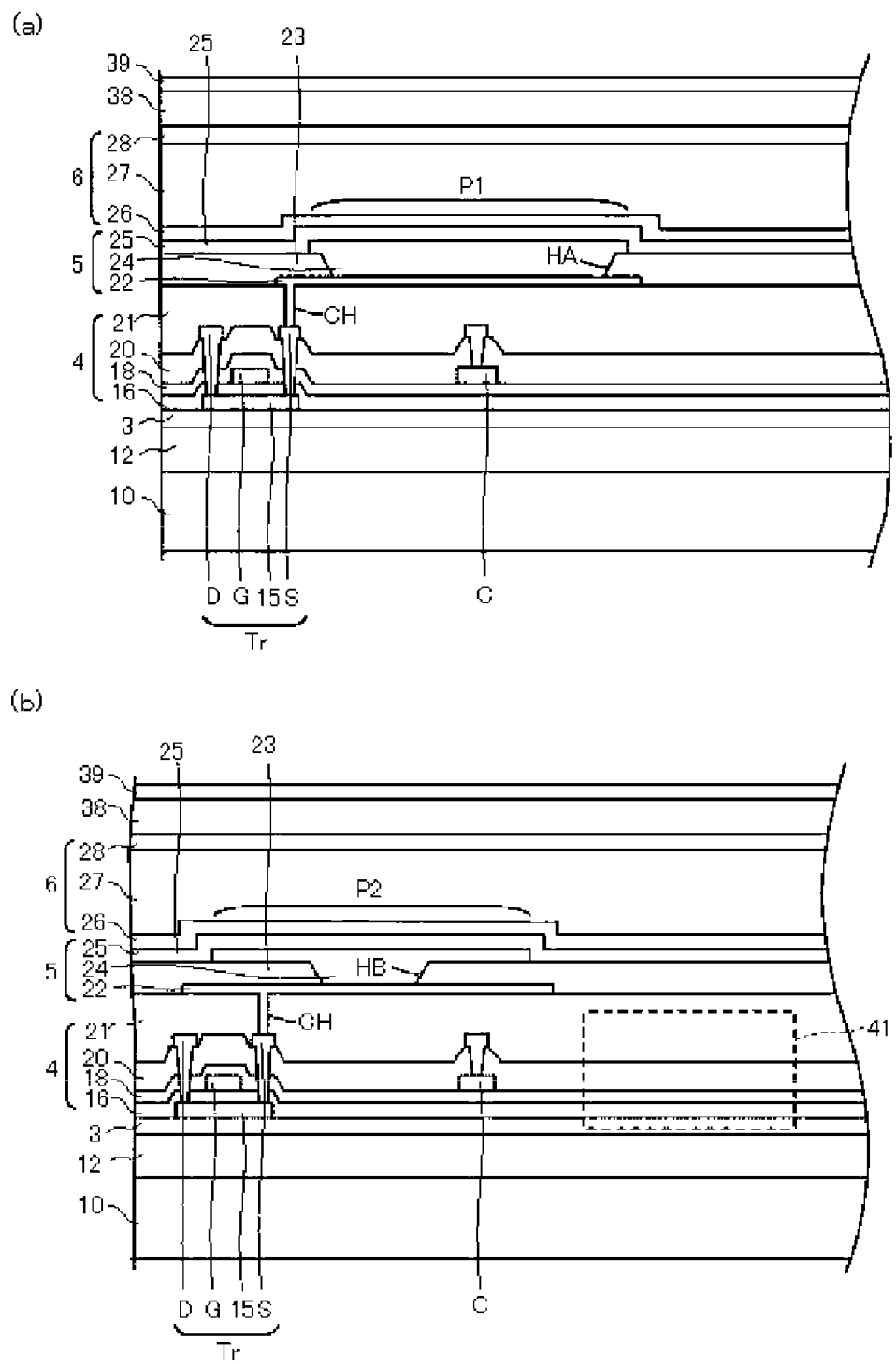
FIG. 4($a$) and FIG. 4($b$) are cross-sectional views describing the structures of the subpixels in the display region and the dummy display region illustrated in FIG. 2, respectively.

FIG. 1 is a side view illustrating a configuration of main portions of an organic EL display device according to an embodiment of the disclosure. FIG. 2 is a plan view illustrating the configuration of the main portions of the organic EL display device. FIG. 3($a$) and FIG. 3($b$) are plan views describing structures of subpixels in a display region and a dummy display region illustrated in FIG. 2, respectively. FIG. 4($a$) and FIG. 4($b$) are cross-sectional views describing the structures of the subpixels in the display region and the dummy display region illustrated in FIG. 2, respectively.

As illustrated in FIG. 1 and FIG. 2, an organic EL display device 1 includes a display region DA that is formed in a rectangular shape and is configured to display an image, and a dummy display region DB (illustrated by a hatched portion in FIG. 2) and a frame region F that are sequentially provided at the periphery of the display region DA. Further, in the frame region F, a terminal portion E is provided in an end portion of the frame region F, and wiring line (not illustrated) that is provided in a plurality of light-emitting elements to be described below, which define the display region DA, is connected to the terminal portion E. Further, a flexible printed circuit board (not illustrated) is connected to the terminal portion E, for example, and signals, a power supply voltage, and the like are supplied to pixels via the flexible printed circuit board.

Further, a plurality of subpixels, which serve as a plurality of first pixels, are provided in the display region DA. Specifically, as illustrated in FIG. 3(a), a red subpixel P1r for displaying a red color, a green subpixel P1g for displaying a green color, and a blue subpixel P1b for displaying a blue color are provided in the display region DA. Then, in the display region DA, one pixel is configured by the three adjacent subpixels P1r, P1g, and P1b (hereinafter, collectively referred to as a "subpixel P1"). Note that the subpixel P1 is also referred to as an effective display pixel.

Further, in the dummy display region DB, a plurality of subpixels, which serve as a plurality of second pixels, are provided. Specifically, as illustrated in FIG. 3(b), a red subpixel P2r for displaying the red color, a green subpixel P2g for displaying the green color, and a blue subpixel P2b for displaying the blue color are provided in the dummy display region DB. Then, in the dummy display region DB, one pixel is configured by the three adjacent subpixels P2r, P2g, and P2b (hereinafter, collectively referred to as a "subpixel P2"). Note that the subpixel P2 is also referred to as a dummy pixel.

Further, the organic EL display device 1 is provided with a luminance sensor region DC that detects a light emission luminance of the dummy display region DB. Specifically, as illustrated by a cross hatched portion in FIG. 1, the luminance sensor region DC is provided, in a plan view, so as to face, of four dummy display region portions corresponding to four sides that configure the frame-shaped dummy display region DB, the dummy display region portion corresponding to the upper side, for example. Further, at least one light receiving element (not illustrated), such as a photodiode, is provided on a counter substrate 40 in the luminance sensor region DC, and the luminance (light emission luminance) of light from the subpixels P2 is detected by the light receiving element. Note that the counter substrate 40 is provided on a substrate 10, on which the subpixels P1 are formed, so as to cover the display region DA, the dummy display region DB, and the frame region F, and the counter substrate 40 includes a function film and the like to be described below.

Note that in the description above, a case is described in which the luminance sensor region DC is provided so as to face the dummy display region portion corresponding to the upper side, but the luminance sensor region DC of the present embodiment is not limited thereto, and may be provided in any region as long as the light receiving element (luminance sensor), which detects the luminance of the light from at least one of the subpixels P2 among the plurality of subpixels P2 provided in the dummy display region DB, is provided in the region.

Further, in the dummy display region DB, in the subpixels P2 facing the luminance sensor region DC, since a display surface side (in other words, a light emission side) of the organic EL display device 1 is covered by the light receiving element, the light from the subpixels P2 is not visible to a user. Thus, the light from the subpixels P2 does not contribute to an information display on the display surface, but, as will be described below in detail, the light from the subpixels P2 is used for degradation compensation of the subpixels P1.

On the other hand, in the dummy display region DB, the light from the subpixels P2 that do not face the luminance sensor region DC is visible to the user, and the light from the subpixels P2 is used together with light from the subpixels P1 to display information, or the light from the subpixels P2 and the light from the subpixels P1 are used to display information independently of each other. In other words, in the organic EL display device 1 according to the present embodiment, by reducing the size of the luminance sensor region DC, an effective display region on the display surface can be made larger.

As illustrated in FIG. 4(a) and FIG. 4(b), the organic EL display device 1 of the present embodiment is of a top-emitting type that emits light upward, and includes, in order from the bottom, the substrate 10, a resin layer 12, a base coat layer 3, a TFT layer 4, a light-emitting element layer 5, a sealing layer 6, an adhesive layer 38, and a function film 39.

The substrate 10 is formed of a polyethylene terephthalate (PET) resin, for example. Further, examples of the material of the resin layer 12 include a polyimide resin, an epoxy resin, and a polyamide resin.

The base coat layer 3 is a layer that inhibits water, oxygen and the like from reaching the TFT layer 4 or the light-emitting element layer 5, and is configured by a silicon oxide film, a silicon nitride film, or a silicon oxynitride film, or by a layered film of these, formed by CVD.

The TFT layer 4 includes a semiconductor film 15, an inorganic insulating film 16 (a gate insulating film) formed in a layer above the semiconductor film 15, a gate electrode G formed in a layer above the inorganic insulating film 16, an inorganic insulating film 18 formed in a layer above the gate electrode G, a capacitance electrode C formed in a layer above the inorganic insulating film 18, an inorganic insulating film 20 formed in a layer above the capacitance electrode C, a source electrode S and a drain electrode D formed in a layer above the inorganic insulating film 20, and a flattening film 21 formed in a layer above the source electrode S and the drain electrode D.

Further, in the TFT layer 4, a thin film transistor Tr (a light emission control transistor) is configured that includes the semiconductor film 15, the gate electrode G, the drain electrode D, and the source electrode S. Further, the source electrode S is connected to a source region of the semiconductor film 15 via a contact hole CH, and the drain electrode D is connected to a drain region of the semiconductor film 15.

Further, the semiconductor film 15 is formed of low-temperature polysilicon (LTPS) or an oxide semiconductor, for example. Note that in FIG. 4(a) and FIG. 4(b), a case is illustrated in which the thin film transistor Tr having a top gate structure is used, but the present embodiment is not limited thereto, and a thin film transistor having a bottom gate structure may be used.

The inorganic insulating films 16, 18, and 20 can be formed, for example, of a silicon oxide (SiOx) film or a silicon nitride (SiNx) film, or a layered film of these, formed by CVD.

The flattening film 21 may be formed, for example, of a coatable photosensitive organic material such as a polyimide resin and an acrylic resin.

The gate electrode G, the source electrode S, and the drain electrode D are formed of a metal single layer film or a layered film including, for example, at least one of aluminum (Al), tungsten (W), molybdenum (Mo), tantalum (Ta), chromium (Cr), titanium (Ti), or copper (Cu).

The light-emitting element layer 5 (an organic light-emitting diode layer, for example) includes an anode electrode 22 formed in a layer above the flattening film 21, an edge cover 23 that defines the subpixels P1 or P2 in an active area (a region overlapping with the light-emitting element layer 5), a light-emitting layer 24 formed in a layer above the anode electrode 22, and a cathode electrode 25 formed in a layer above the light-emitting layer 24. A light-emitting element (an organic light-emitting diode (OLED), for example) is configured to include the anode electrode 22, the light-emitting layer 24, and the cathode electrode 25. Note that, in addition to this description, in the organic EL display device 1, the anode electrode 22 and the cathode electrode 25 can be disposed in a reversed manner in the vertical direction.

The edge cover 23 surrounds an end portion of the anode electrode 22. Further, this edge cover 23 is formed of an organic film, for example, of a polyimide resin, an acrylic resin, a polysiloxane resin, a novolak resin, or the like.

The light-emitting layer 24 is formed in a region (a light-emitting region) surrounded by the edge cover 23, using vapor deposition or an ink-jet method. When the light-emitting element layer 5 is an organic light-emitting diode (OLED) layer, for example, a hole injection layer, a hole transport layer, the light-emitting layer 24, an electron transport layer, and an electron injection layer are sequentially layered above the bottom face of the edge cover 23 (a section from which the anode electrode 22 is exposed). Here, the layers aside from the light-emitting layer 24 can be common layers.

The anode electrode 22 is photoreflective and is formed by layering indium tin oxide (ITO) and an alloy containing Ag, for example. Note that the anode electrode 22 is an example of a first electrode in the claims.

The cathode electrode 25 is formed of a transparent conductive material such as ITO or indium zinc oxide (IZO), for example. Note that the cathode electrode 25 is an example of a second electrode in the claims.

When the light-emitting element layer 5 is the OLED layer, positive holes and electrons recombine inside the light-emitting layer 24 in response to a drive current between the anode electrode 22 and the cathode electrode 25, and light is emitted as a result of excitons generated by the recombination falling into a ground state. Since the cathode electrode 25 is transparent and the anode electrode 22 is photoreflective, the light emitted from the light-emitting layer 24 travels upwards and results in top emission.

The light-emitting element layer 5 is not only limited to being configured by the OLED elements, but may also be configured by inorganic light emitting diodes or quantum dot light emitting diodes.

The sealing layer 6 is transparent, and includes an inorganic sealing film 26 that covers the cathode electrode 25, an organic sealing film 27 formed in a layer above the inorganic sealing film 26, and an inorganic sealing film 28 that covers the organic sealing film 27. The inorganic sealing films 26 and 28 are each formed of a silicon oxide film, a silicon nitride film, a silicon oxynitride film, or a layered film of these, formed by CVD using a mask, for example. The organic sealing film 27 is thicker than the inorganic sealing films 26 and 28, is a transparent organic film, and is formed of a coatable photosensitive organic material such as a polyimide or an acrylic. Specifically, the organic sealing film 27 is formed, for example, by applying an ink containing the above-described photosensitive organic material onto the inorganic sealing film 26 using an ink-jet method, and then curing the ink by UV irradiation. This sealing layer 6 covers the light-emitting element layer 5 and inhibits foreign matter, such as water and oxygen, from infiltrating into the light-emitting element layer 5.

The function film 39 has an optical compensation function, a touch sensor function, a protection function, or the like, for example.

Here, a configuration of the above-described subpixels P1 and P2 will be described more specifically.

As illustrated in FIG. 3(a) and FIG. 4(a), the subpixel P1 includes the anode electrode (a first pixel electrode) 22, the edge cover 23 having an opening (a first opening) HA, and the light-emitting layer (a first light-emitting layer) 24 disposed in a layer above the edge cover 23. In the subpixel P1, the edge cover 23 surrounds the entire periphery of the opening HA. The light-emitting layer 24 is formed so as to completely fill at least the opening HA. The surface area of the light-emitting layer 24 is greater than the surface area of the opening HA. Of the light-emitting layer 24, a range overlapping with the opening HA contributes to the information display in the display region DA.

As illustrated in FIG. 3(b) and FIG. 4(b), the subpixel P2 includes the anode electrode (the second pixel electrode) 22, the edge cover 23 having an opening (a second opening) HB, and the light-emitting layer 24 (a second light-emitting layer) that is disposed in the layer above the edge cover 23 and has the same shape and the same size as the light-emitting layer 24 of the subpixel P1. In the subpixel P2, the edge cover 23 surrounds the entire periphery of the opening HB. The light-emitting layer 24 is formed so as to completely fill at least the opening HB. The surface area of the light-emitting layer 24 is greater than the surface area of the opening HB. Of the light-emitting layer 24, a range overlapping with the opening HB contributes to the information display in the dummy display region DB. Further, in the subpixel P2, the size of the anode electrode 22 is configured to be the same as the size of the anode electrode 22 in the subpixel P1 (see FIG. 3(a) and FIG. 3(b)). However, in the subpixel P2, since the opening HB is smaller than the opening HA of the subpixel P1, the size of the anode electrode 22 of the subpixel P2 may be made smaller than the size of the anode electrode 22 of the subpixel P1.

The "same shape and the same size" described above means that when the luminescent material of the light-emitting layer 24 is deposited in the display region DA and the dummy display region DB using masks having mask patterns of the same shape and the same size, the light-emitting layers 24 of the same shape and the same size are effectively formed in the display region DA and the dummy display region DB. Therefore, the light-emitting layer 24 in the subpixel P1 and the light-emitting layer 24 in the subpixel P2 need not necessarily have exactly the same shape and the same size.

As illustrated in FIG. 3(a) and FIG. 3(b), the opening HA, which is provided on the inner side of the anode electrode 22 formed in the display region DA, is larger than the opening HB, which is provided on the inner side of the anode electrode 22 formed in the dummy display region DB. Furthermore, the light-emitting layer 24 formed in the display region DA has the same shape and the same size as the light-emitting layer 24 formed in the dummy display region DB. When manufacturing the organic EL display device 1, the light-emitting layers 24 are deposited through mask openings each having the same size and formed in a fine metal mask (not illustrated) for depositing the luminescent material, in both the display region DA and the dummy display region DB. In other words, the size of the mask opening formed in an area of the fine metal mask corresponding to the display region DA is the same as the size of the mask opening formed in an area of the fine metal mask corresponding to the dummy display region DB.

In other words, as described above, since the opening HB is smaller than the opening HA, even if the accuracy of a vapor deposition pattern used for depositing the luminescent material in the dummy display region DB is low, the light-emitting layer 24 is formed so as to completely cover the opening HB in the dummy display region DB. Thus, the subpixels P2 that function normally can be formed in the dummy display region DB. By arranging the above-described subpixels P2 in the dummy display region DB, the organic EL display device 1 can also use the dummy display region DB, in addition to the display region DA, to display information. In this way, in the organic EL display device 1, a region (the dummy display region) that is provided at the periphery of the display region DA and in which nothing is displayed in a known organic EL display device, can be used as the dummy display region DB in which information can be displayed. Accordingly, on the display surface, the organic EL display device 1 can make the surface area of the entire region that is capable of displaying information larger than that of known techniques.

Figure 5:
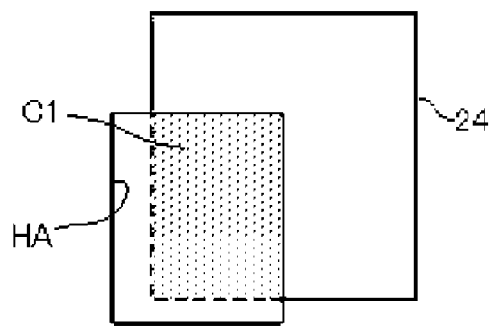
FIG. 5($a$) and FIG. 5($b$) are diagrams describing problems with subpixel structures of Comparative Example 1 and Comparative Example 2, respectively, and FIG. 5($c$) is a diagram describing an effect of the subpixels in the dummy display region according to the present embodiment.
Figure 5:
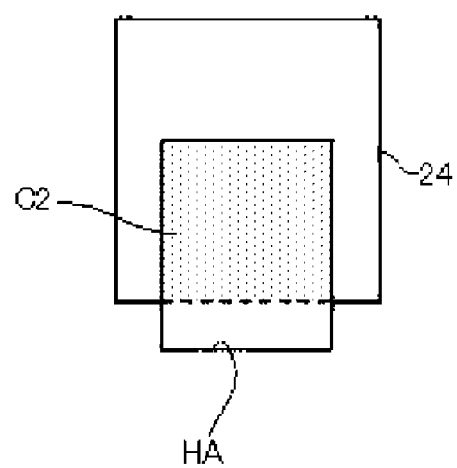
Figure 5:
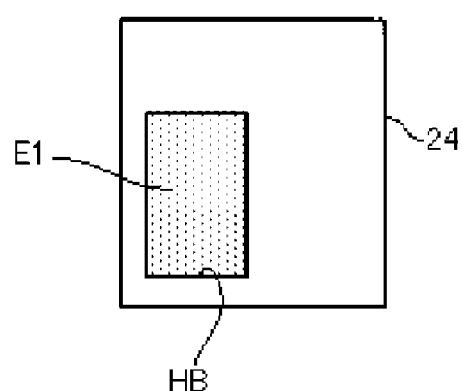

Here, an effect of reducing the size of the opening HB of the subpixel P2 in the dummy display region DB will be specifically described with reference to FIG. 5. FIG. 5(*a*) and FIG. 5(*b*) are diagrams describing problems with subpixel structures of Comparative Example 1 and Comparative Example 2, respectively, and FIG. 5(*c*) is a diagram describing an effect of the subpixels in the dummy display region according to the present embodiment.

As illustrated by Comparative Example 1 and Comparative Example 2 in FIG. 5(*a*) and FIG. 5(*b*), when the opening HA of the edge cover 23 having the same size as the subpixel P1 is used for the subpixel P2 of the dummy display region DB, if there is displacement between the opening HA and the vapor deposition pattern of the light-emitting layer 24, that is, between the opening HA and a formation pattern of the light-emitting layer 24, with respect to the subpixels P2 of Comparative Example 1 and Comparative Example 2, an effective light-emitting area ends up being smaller than the opening HA of the edge cover 23, as illustrated in FIG. 5(*a*) and FIG. 5(*b*), respectively. As a result, in the subpixels P2 of Comparative Example 1 and Comparative Example 2, the light-emitting area becomes different for each of the subpixels P2, and the light-emitting area of the subpixel P2 cannot be controlled. Thus, the subpixels P2 cannot function normally as measurement pixels for the degradation compensation.

In contrast, in the present embodiment, since the opening HB, which is smaller than the opening HA, is used in the edge cover 23 for the subpixels P2 in the dummy display region DB, as illustrated in FIG. 5(*c*), even when there is displacement between the opening HB and the formation pattern of the light-emitting layer 24, the opening HB and the light-emitting layer 24 can be caused to completely overlap with each other, as illustrated by a dotted region E1 in FIG. 5(*c*). Thus, the effective light-emitting area in the subpixel P2 can be controlled, and a constant light-emitting area can be obtained. In other words, in the present embodiment, the subpixels P2 that function normally can be easily formed in the dummy display region DB.

Further, as illustrated in FIG. 4(*a*), in the display region DA, in order to secure sufficient light emission from the light-emitting layer 24, a contact hole cannot be provided so as to overlap with a section of the light-emitting layer 24 that fills the opening HA. Thus, as illustrated in (a) of FIG. 4, in the display region DA, a contact hole of the thin film transistor Tr is formed in a position that does not overlap with the opening HA.

On the other hand, in the dummy display region DB, a section of the light-emitting layer 24 that does not overlap with the opening HB does not function as the effective light-emitting layer 24. Thus, the anode electrode 22 can be made smaller in the dummy display region DB than in the display region DA, so the layer of the anode electrode 22 can also be used as auxiliary wiring line (in FIG. 3 and FIG. 4, the size of the anode electrode 22 is the same in the display region DA and the dummy display region DB). Further, as will be described later, in the dummy display region DB, a pixel circuit can be commonly used, and thus, an additional thin film transistor can be provided in an empty space 41. Furthermore, various types of display control circuit including the additional thin film transistor, such as a monolithic gate driver or a monolithic source driver, can be formed in the dummy display region DB. Therefore, in the present embodiment, the organic EL display device 1 including a display control circuit formed in the dummy display region DB can be realized.

Figure 6:
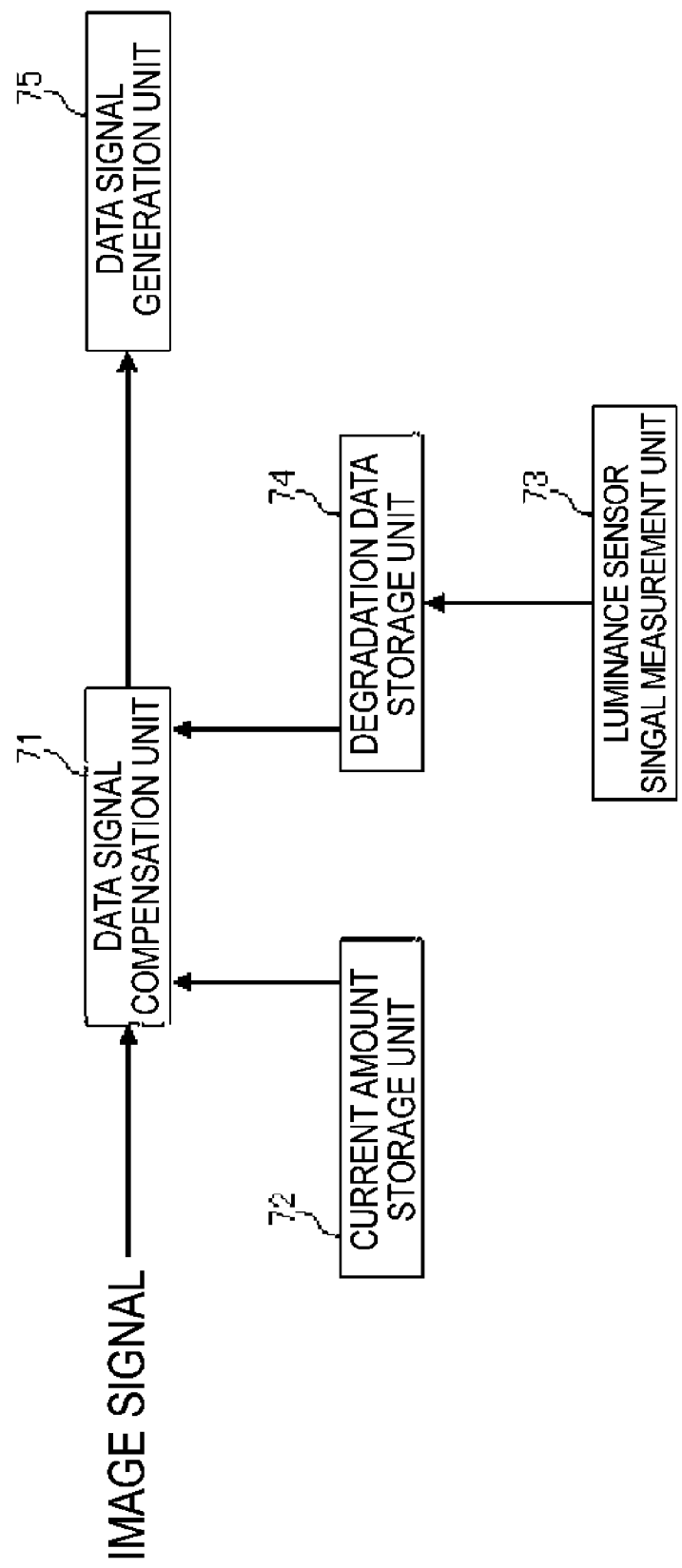
FIG. 6 is a diagram describing a configuration example of a compensation circuit for a data signal in the above-described organic EL display device.
Figure 7:
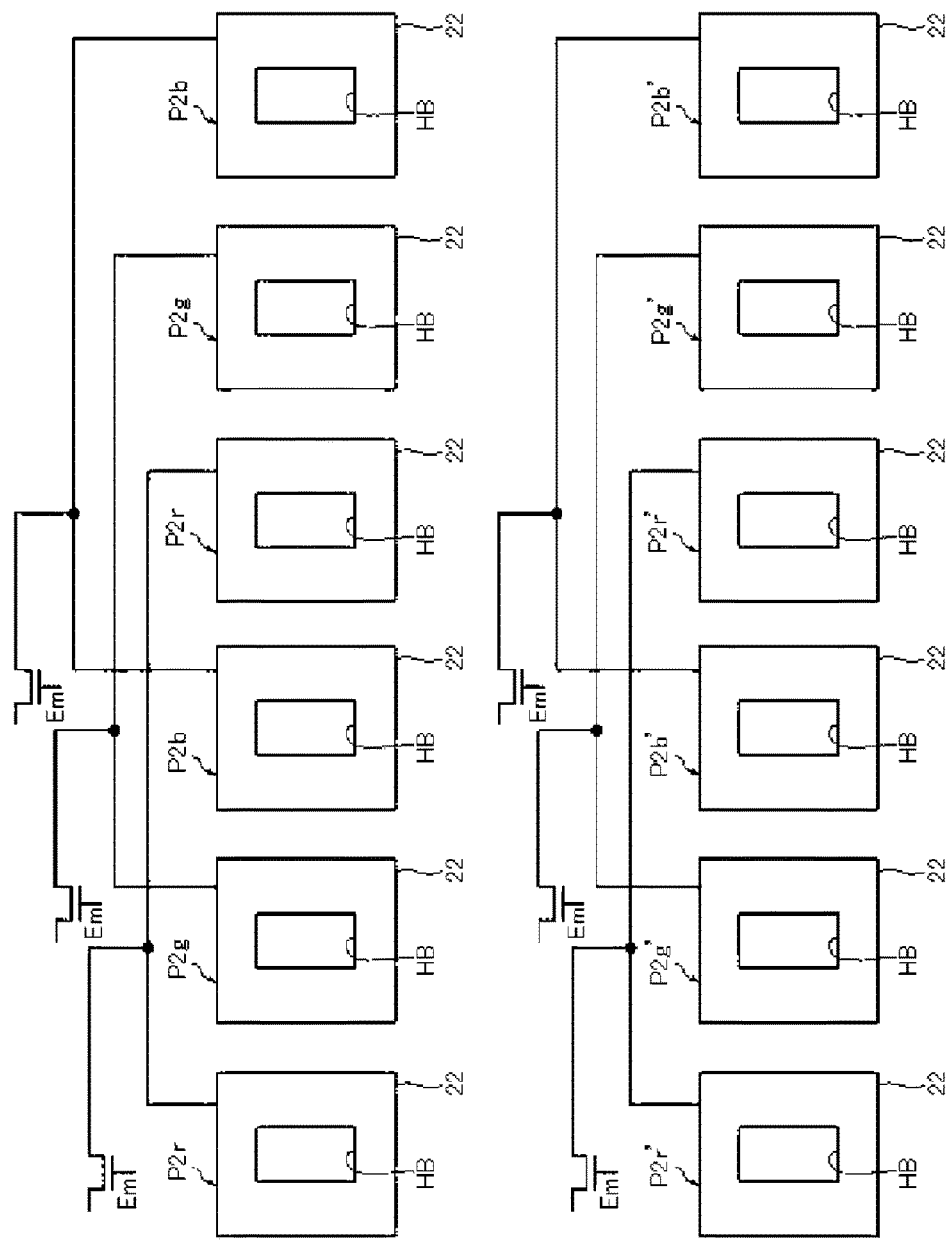
FIG. 7 is a diagram describing an example of driving subpixels in the above-described dummy display region.
Figure 8:
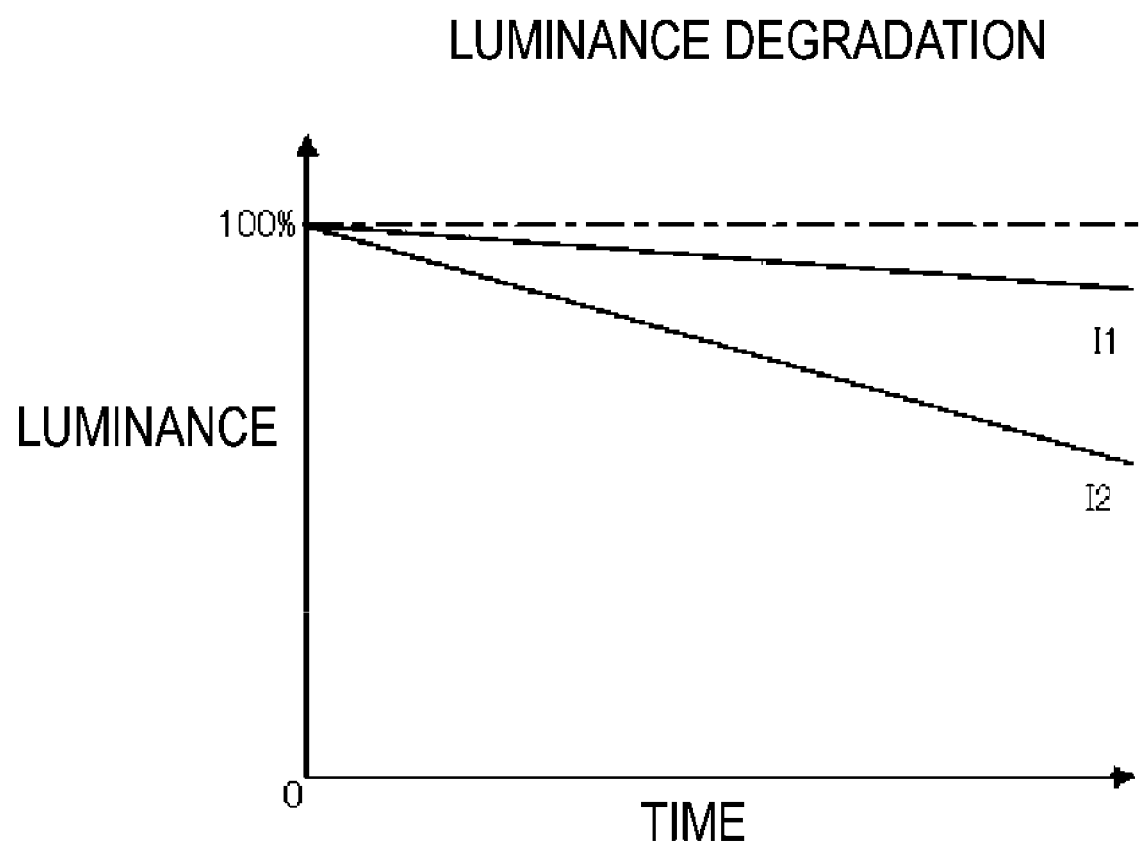
FIG. 8 is a graph describing a specific example of luminance degradation of the above-described organic EL display device.

Next, with reference to FIG. 6 to FIG. 8, the degradation compensation using the subpixels P2 in the organic EL display device 1 of the present embodiment will be specifically described. FIG. 6 is a diagram describing a configuration example of a compensation circuit for a data signal in the above-described organic EL display device. FIG. 7 is a diagram describing an example of driving subpixels in the above-described dummy display region. FIG. 8 is a graph describing a specific example of luminance degradation in the above-described organic EL display device.

First, with reference to FIG. 8, degradation over time of the light-emitting element (the light-emitting element layer 5) of the subpixel of the organic EL display device will be specifically described.

In general, a current-driven light-emitting element whose light emission luminance changes in accordance with a current amount, degrades with the passage of time in accordance with the current amount flowing through the light-emitting element. For example, as illustrated in FIG. 8, in the light-emitting element for the red color, when an initial luminance is considered to be 100%, the luminance decreases in accordance with the passage of time and the current amount supplied to the light-emitting element. Specifically, when this light-emitting element is driven to emit light at current values respectively corresponding to a low gray scale (a gray scale value of 10, for example) and an intermediate gray scale (a gray scale value of 100, for example), the luminance decreases in accordance with the passage of time (a total light emission time), as illustrated in FIG. 8 by a straight line I1 and a straight line I2, respectively. Note that this light-emitting element is driven to emit the light in accordance with a data signal from a data signal generation unit 75 (FIG. 6), which serves as a data line drive circuit (a source driver) and supplies a current value corresponding to one of 256 gray scale levels (any one of gray scale values from a gray scale value of 0 to a gray scale value of 255), for example. In this way, in the light-emitting element, the luminance decreases (that is, the light-emitting element degrades) in accordance with the passage of time and the current amount. Thus, by measuring degradation data of different current amounts (in other words, current amounts respectively corresponding to at least two gray scale values), a degradation amount of the light-emitting element when caused to emit at another current amount can be ascertained. In other words, in the light-emitting element of each of the subpixels for the red color, the blue color, and the green color, by determining the total current amount that has flowed through the light-emitting elements of the subpixels of each of the colors, based on the data signals that have been input to the light-emitting elements up to a given point in time, the degradation amount of the subpixels can be ascertained based on the determined total current amount and the degradation data, and a data signal that emits light at a desired luminance can be determined.

Thus, as illustrated in FIG. 6, the organic EL display device 1 according to the present embodiment is provided with a data signal compensation unit 71, a current amount storage unit 72, a luminance sensor signal measurement unit 73, a degradation data storage unit 74, and the data signal generation unit 75. Further, the organic EL display device 1 according to the present embodiment is configured such that, in accordance with the light emission period of the light-emitting element of the subpixel P1 in the display region DA, a plurality of degradation observation data signals having mutually different gray scale values are input to the subpixel P2 in the dummy display region DB, thereby causing the light-emitting element of the subpixel P2 to emit light.

Specifically, for example, as illustrated in FIG. 7, a degradation observation data signal corresponding to the low gray scale (the gray scale value of 10, for example) is input to each of two of the red subpixels P2r, two of the green subpixels P2g, and two of the blue subpixels P2b in the upper row of the drawing, and those subpixels are driven to emit light. In addition, a degradation observation data signal corresponding to the intermediate gray scale (the gray scale value of 100, for example) is input to each of two red subpixels P2r', two green subpixels P2g', and two blue subpixels P2b' in the bottom row of the drawing, and those subpixels are driven to emit light. (Although the description is given using the two subpixels P2 for each of the colors, this is to increase the luminance for easy measurement, and the number of the subpixels P2 for each of the colors may be one or three or more). In this way, two types of the degradation observation data signal having the low gray scale value and the intermediate gray scale value, respectively, are used. This is because the light-emitting element of the subpixel P1 in the display region DA rarely continues to emit light at the highest luminance (the gray scale value of 255 in the present embodiment) at all times, and it is thus sufficient that the degradation observation data signal, which is input in the dummy display region DB, be the degradation observation data signal corresponding to the intermediate gray scale at the very most. Also, this is because the degradation amount of the light-emitting element of the subpixel P1 in the display region DA can be ascertained by measuring the degradation amounts of at least two gray scale levels.

Referring back to FIG. 6, in the organic EL display device 1, an image signal for performing information display from the outside is input to the data signal compensation unit 71. Further, the current amount storage unit 72 stores the current amount that has flowed through the light-emitting element (light-emitting element layer 5) of each of the plurality of subpixels P1 up to the given point in time. The luminance sensor signal measurement unit 73 inputs a detection signal from the above-described light receiving element provided in the luminance sensor region DC, in order to measure the luminance of the light emitted by the subpixel P2 in the dummy display region DB. Further, the degradation data storage unit 74 stores measurement result data from the luminance sensor signal measurement unit 73. In other words, the degradation amount of the light-emitting element of the subpixel P2, which is a measurement target, is held in the degradation data storage unit 74. The data signal compensation unit 71 ascertains the degradation amount of each of the plurality of subpixels P1 based on the above-described image signal, the current amounts stored in the current amount storage unit 72, and the degradation amounts (corresponding to FIG. 8) stored in the degradation data storage unit 74, converts the image signal input from the outside into the data signal that emits the light at the desired luminance, and outputs the image signal to the data signal generation unit 75. Then, the data signal generation unit 75 outputs the data signal after the degradation compensation, to each of the plurality of subpixels P1 in the display region DA. In the above-described manner, in the organic EL display device 1 according to the present embodiment, compensation that takes into account the degradation of the light-emitting elements of the subpixels P1 can be performed.

In the organic EL display device 1 according to the present embodiment configured as described above, the opening (second opening) HB that is provided on the inner side of the anode electrode (the second pixel electrode, which is the first electrode) 22 formed in the dummy display region DB is smaller than the opening (first opening) HA that is provided on the inner side of the anode electrode (the first pixel electrode, which is the first electrode) 22 formed in the display region DA. Further, in the organic EL display device 1 according to the present embodiment, the light-emitting layer (first light-emitting layer) 24 formed in the display region DA has the same shape and the same size as the light-emitting layer (second light-emitting layer) 24 formed in the dummy display region DB. As a result, in the organic EL display device 1 according to the present embodiment, as described above with reference to FIG. 5, it is possible to prevent a drop in a manufacturing yield even when the subpixels (dummy pixels) P2 are provided in the organic EL display device 1.

Further, in the organic EL display device 1 according to the present embodiment, since the luminance sensor region DC that detects the light emission luminance of the dummy display region DB is provided, the compensation that takes into account the degradation of the light-emitting elements of the subpixels P1 can be performed, as described above with reference to FIG. 6. As a result, the organic EL display device 1 having an excellent display quality (light emission quality) can be easily configured.

Other Configuration Examples of Organic EL Display Device 1

Figure 9:
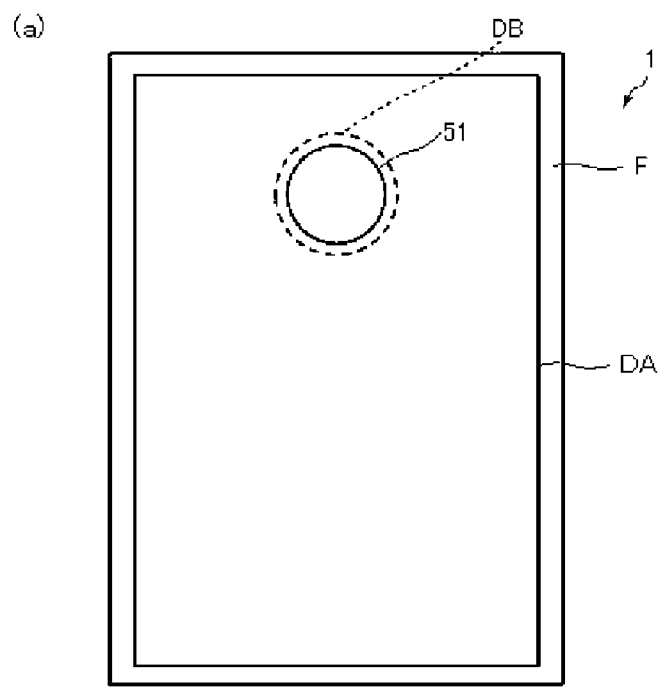
FIG. 9($a$) and FIG. 9($b$) are each a plan view illustrating another configuration example of the main portions of the organic EL display device according to the embodiment.
Figure 9:
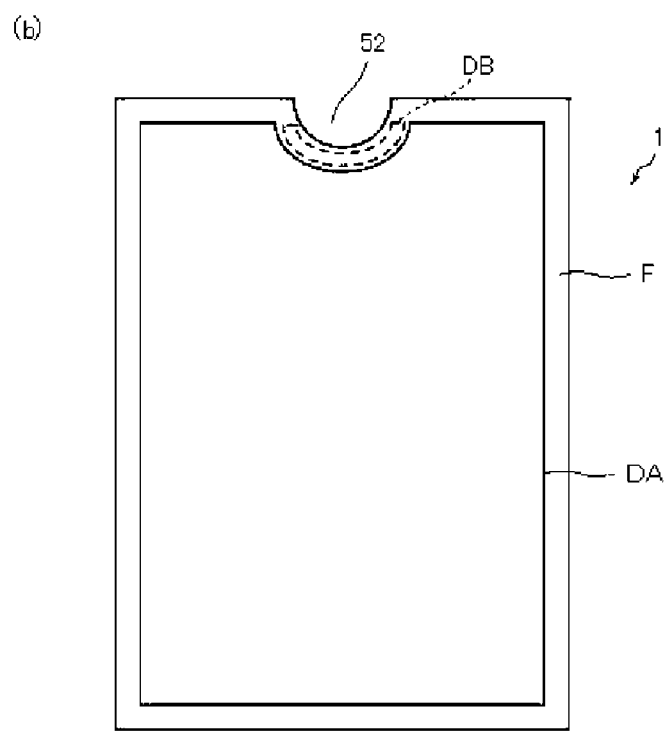

FIG. 9(a) and FIG. 9(b) are each a plan view illustrating another configuration example of the main portions of the organic EL display device according to the embodiment. In FIG. 9(a), the organic EL display device 1 includes the display region DA, the dummy display region DB, the frame region F, and a cutout portion 51. The dummy display region DB corresponds to a part of the frame region F. In other words, the plurality of subpixels P2 are formed in the part of the frame region F. The cutout portion 51, which is formed by cutting out a part of the display region DA, is formed in the interior of the display region DA. The dummy display region DB is formed at the periphery of the display region DA, and is also formed at the periphery of the cutout portion 51. More specifically, the dummy display region DB is formed between the display region DA and the cutout portion 51 in the planar direction of the organic EL display device 1, so as surround the cutout portion 51.

In FIG. 9(b), the organic EL display device 1 includes the display region DA, the dummy display region DB, the frame region F, and a cutout portion 52. The frame region F is formed surrounding the display region DA. The cutout portion 52 is formed at an edge of the organic EL display device 1, by cutting out a part of the display region DA and a part of the frame region F. The dummy display region DB corresponds to a part of the frame region F. In other words, the plurality of subpixels P2 are formed in the part of the frame region F. The dummy display region DB is formed at the periphery of the display region DA, and is also formed at the periphery of the cutout portion 52. More specifically, the dummy display region DB is formed between the display region DA and the cutout portion 52 in the planar direction of the organic EL display device 1, so as to be in contact with the cutout portion 52.

Figure 10:
FIG. 10 is a plan view illustrating another configuration example of the main portions of the organic EL display device according to the embodiment.

Further, as described in the description above, each of the subpixels P2r, P2g, and P2b may be configured by the plurality of subpixels P2. For example, as illustrated in FIG. 10, two each of subpixels P2r1, P2g1, and P2b1 may be used as the subpixels P2r1, P2g1, and P2b1, respectively, and two each of subpixels P2r2, P2g2, and P2b2 may be used as the subpixel P2r2, P2g2 and P2b2, respectively. When the subpixels P2r1, P2g1, and P2b1 and the subpixels P2r2, P2g2, and P2b2 are configured in this manner, the plurality of subpixels P2, which are driven by the degradation observation data signal having the gray scale value of 10, are present. As a result, variations in the degradation of the light-emitting elements of the subpixels P2 can be reduced, and even when the sensitivity of the light receiving element (luminance sensor) is low, the luminance can be measured by measuring the luminance from the light-emitting elements of the plurality of subpixels P2.

Further, in addition to the description above, for example, each of the plurality of subpixels P2r may include a pixel circuit, and the degradation observation data signal may be input to each of the plurality of subpixels P2r. Also, as exemplified in FIG. 7, a plurality of the anode electrodes (second pixel electrodes) 22 of the subpixels P2r may be electrically connected with each other, and the same degradation observation data signal may be input thereto. Furthermore, as illustrated in FIG. 11, the plurality of subpixels P2, for example, two of the subpixels P2r may include the common anode electrode (second pixel electrode) 22, and the same degradation observation data signal may be input thereto. Alternatively, the anode electrodes 22 may be separately provided, and may be configured to share a pixel circuit (such as sharing a drive transistor). In this way, the pixel circuit is shared in the dummy display region DB, and, using an empty space, various display control circuits, such as a monolithic gate driver or a monolithic source driver, can be formed.

Further, in the description above, a case is described in which the data signals of the two gray scales (the low gray scale and the intermediate gray scale) are used as the degradation observation data signal. However, the number of the gray scales is not limited to two, and by determining the degradation amounts of three or more gray scales, the measurement accuracy can be further improved, and the subpixels P1 can be more easily caused to emit the light at the desired luminance.

Furthermore, in the description above, a case is described in which the degradation observation data signal of the constant gray scale is used, but the present embodiment is not limited thereto. For example, by determining an image signal obtained by averaging the data signals for all of the subpixels (first pixels) P1 for each frame, by inputting, as the degradation observation data signal, the image signal to the subpixels P2 in the dummy display region DB, thereby causing the subpixels P2 to emit light, and by measuring the luminance, the degradation amount obtained when the average image signal is continuously input can be determined. In such a configuration, installation of the current amount storage unit 72 can be omitted. Further, assuming that the degradation of all the subpixels P1 of each of the colors is the degradation obtained when the average image signal is continuously input, the compensation can be easily performed at once. At this time also, the subpixel P1 having the same color may be configured by the plurality of subpixels P1.

Further, in the description above, a configuration is described in which the subpixels P1 and P2 have the red, blue, and green colors. but the luminescent colors of the subpixels P1 and P2 are not limited thereto, and may be magenta, yellow, white, or the like.

Further, in each of the above-described embodiments, an organic EL display device is described as an example of a display device. However, the disclosure is applicable to a display device including a plurality of light-emitting elements that are driven by a current. For example, the disclosure is applicable to a display device including quantum dot light-emitting diodes (QLEDs), which are light-emitting elements using a quantum dot-containing layer.

INDUSTRIAL APPLICABILITY

The disclosure is useful in a display device that can prevent a deterioration in manufacturing yield even when dummy pixels are provided therein.

The invention claimed is:

1. A display device including a thin film transistor layer and a light-emitting element layer, the display device comprising:
   a plurality of thin film transistors included in the thin film transistor layer;
   a first electrode layer included in the light-emitting element layer and comprising a first pixel electrode and a second pixel electrode;
   an edge cover layer included in the light-emitting element layer and formed in a layer above the first electrode layer;
   a light-emitting layer included in the light-emitting element layer and formed in a layer above the first electrode layer;
   a second electrode layer included in the light-emitting element layer and formed in a layer above the light-emitting layer;
   a display region;
   a dummy display region; and
   a luminance sensor region configured to detect a light emission luminance of the dummy display region,
   wherein a first opening formed in the edge cover layer that opens on an inner side of the first pixel electrode is larger than a second opening formed in the edge cover layer that opens on an inner side of the second pixel electrode, the first pixel electrode formed in the display region, and the second pixel electrode formed in the dummy display region, a first light-emitting portion included in the light-emitting layer has the same shape and the same size in a plan view as a second light-emitting portion included in the light-emitting layer, the first light-emitting portion formed in the display region and the second light-emitting portion formed in the dummy display region, and the first pixel electrode is electrically connected to one of the plurality of thin film transistors and the second pixel electrode is electrically connected to another of the plurality of thin film transistors.

2. The display device according to claim 1, further comprising:

a plurality of first pixels formed in the display region; and
a plurality of second pixels formed in the dummy display region,
wherein each of the plurality of first pixels includes the first light-emitting portion,
each of the plurality of second pixels includes the second light-emitting portion, and
a data signal is input to the plurality of first pixels, a degradation observation data signal is input to the plurality of second pixels during a period in which the plurality of first pixels emit light, and the plurality of second pixels emit light.

3. The display device according to claim 2,
wherein the degradation observation data signal includes a first degradation observation data signal, and a second degradation observation data signal having a higher gray scale value than that of the first degradation observation data signal, and
one and another of the plurality of second pixels are caused to emit light by the first degradation observation data signal and the second degradation observation data signal, respectively.

4. The display device according to claim 3,
wherein the second pixels that are caused to emit light by the first degradation observation data signal are present in a plurality thereof, and the second pixels that are caused to emit light by the second degradation observation data signal are present in a plurality thereof.

5. The display device according to claim 2,
wherein the degradation observation data signal is an image signal obtained by averaging the data signals for all of the first pixels for each of a frame.

6. The display device according to claim 5,
wherein the second pixels that are caused to emit light by the degradation observation data signal are present in a plurality thereof.

7. The display device according to claim 1,
wherein the second pixel electrode is smaller than the first pixel electrode.

8. The display device according to claim 1, further comprising:
a plurality of second pixels formed in the dummy display region,
wherein the plurality of second pixels included a plurality of the second pixel electrodes, respectively are electrically connected to each other.

9. The display device according to claim 1, further comprising:
a plurality of second pixels formed in the dummy display region,
wherein the second pixel electrode is larger than the first pixel electrode and is common to the plurality of second pixels.

10. The display device according to claim 1,
wherein a cutout portion is formed in an interior of the display region, the cutout portion being formed by cutting out a part of the display region, and
the dummy display region is formed between the cutout portion and the display region, so as to surround the cutout portion.

11. The display device according to claim 1, further comprising:
a frame region formed surrounding the display region,
wherein a cutout portion is formed in an end portion of the display device, the cutout portion being formed by cutting a part of the display region and a part of the frame region; and
the dummy display region is formed between the cutout portion and the display region so as to be in contact with the cutout portion.

12. The display device according to claim 1,
wherein at least a part of the second light-emitting portion overlaps with at least a part of the another of the plurality of thin film transistor.

* * * * *